(12) United States Patent
Lauffer et al.

(10) Patent No.: US 7,814,649 B2
(45) Date of Patent: Oct. 19, 2010

(54) METHOD OF MAKING CIRCUITIZED SUBSTRATE WITH FILLED ISOLATION BORDER

(75) Inventors: John M. Lauffer, Waverly, NY (US); James M. Larnerd, Binghamton, NY (US); Voya R. Markovich, Endwell, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 89 days.

(21) Appl. No.: 11/482,945

(22) Filed: Jul. 10, 2006

(65) Prior Publication Data

US 2006/0248717 A1    Nov. 9, 2006

Related U.S. Application Data

(62) Division of application No. 10/882,170, filed on Jul. 2, 2004, now Pat. No. 7,157,647.

(51) Int. Cl.
*H05K 3/02* (2006.01)
*H05K 3/10* (2006.01)

(52) U.S. Cl. ............................. 29/846; 29/829; 29/830; 174/255; 174/256

(58) Field of Classification Search .................. 29/846, 29/829, 830, 832, 852, 846; 174/255, 262, 174/256, 259, 264; 430/311, 313
See application file for complete search history.

(56) References Cited

U.S. PATENT DOCUMENTS

| | | | |
|---|---|---|---|
| 4,522,667 A * | 6/1985 | Hanson et al. ................ 156/87 |
| 5,384,433 A | 1/1995 | Osann, Jr. et al. | |
| 5,418,689 A | 5/1995 | Alpaugh et al. | |
| 5,488,540 A | 1/1996 | Hatta | |
| 5,685,070 A | 11/1997 | Alpaugh et al. | |
| 5,736,796 A | 4/1998 | Price et al. | |
| 5,876,842 A * | 3/1999 | Duffy et al. ................. 428/209 |
| 5,912,809 A | 6/1999 | Steigerwald et al. | |
| 6,204,453 B1 | 3/2001 | Fallon et al. | |
| 6,288,906 B1 | 9/2001 | Sprietsma et al. | |
| 6,418,031 B1 | 7/2002 | Archambeault | |
| 6,451,509 B2 * | 9/2002 | Keesler et al. .............. 430/311 |
| 6,557,154 B1 | 4/2003 | Harada et al. | |
| 6,820,332 B2 * | 11/2004 | Japp et al. ..................... 29/852 |

* cited by examiner

*Primary Examiner*—Thiem Phan
(74) *Attorney, Agent, or Firm*—Mark Levy; Lawrence R. Fraley; Hinman, Howard & Kattell

(57) ABSTRACT

A method of making a circuitized substrate which includes a plurality of contiguous open segments along a side edge portion of the at least one electrically conductive layer thereof, these open segments isolated by a barrier of dielectric material which substantially fills the open segments, e.g., during a lamination process which bonds two dielectric layers of the substrate to the conductive layer.

6 Claims, 4 Drawing Sheets

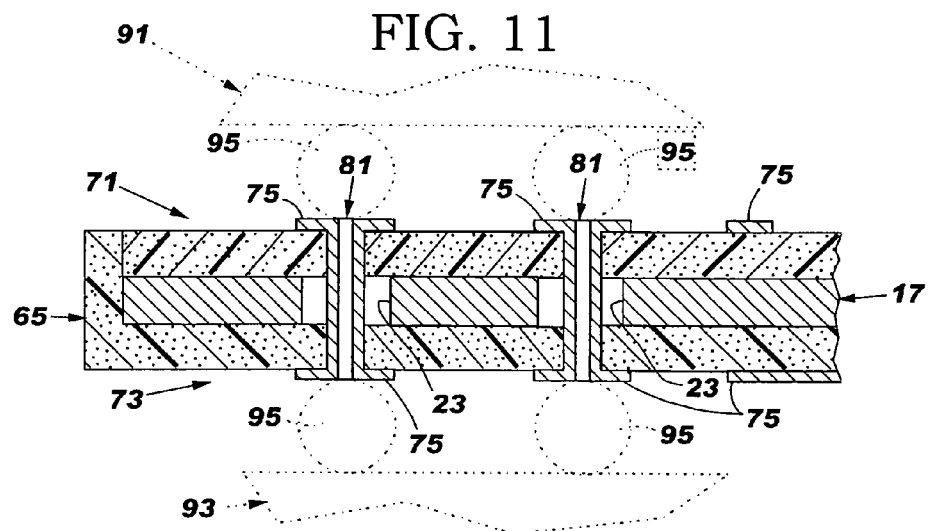
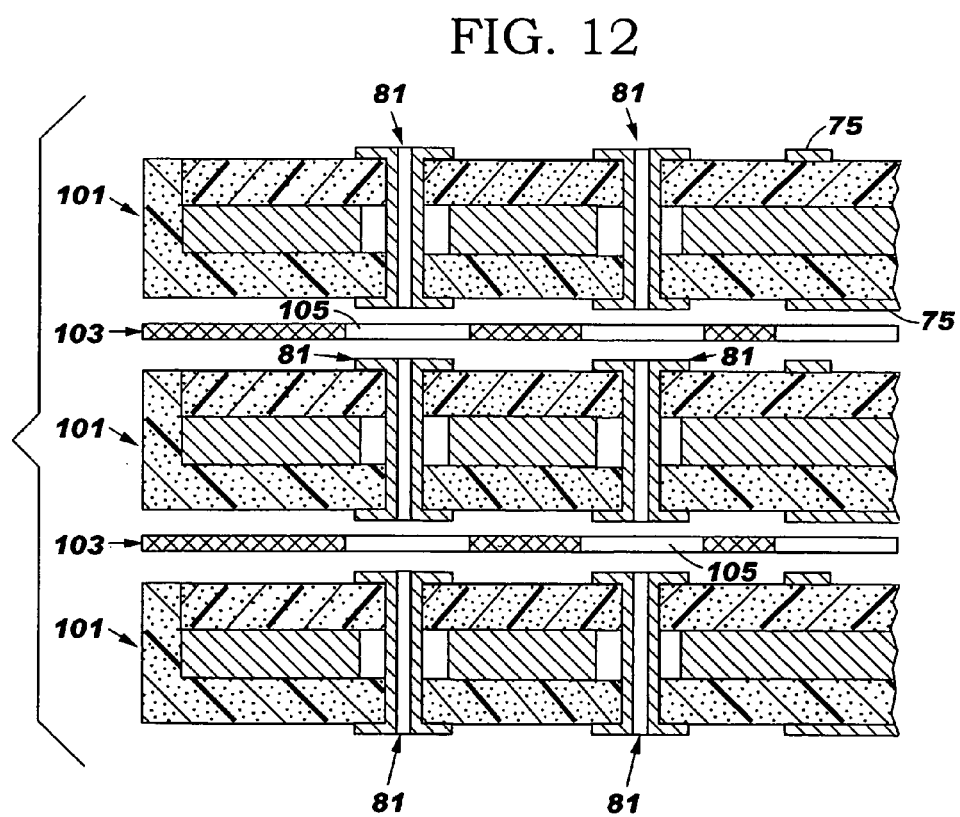

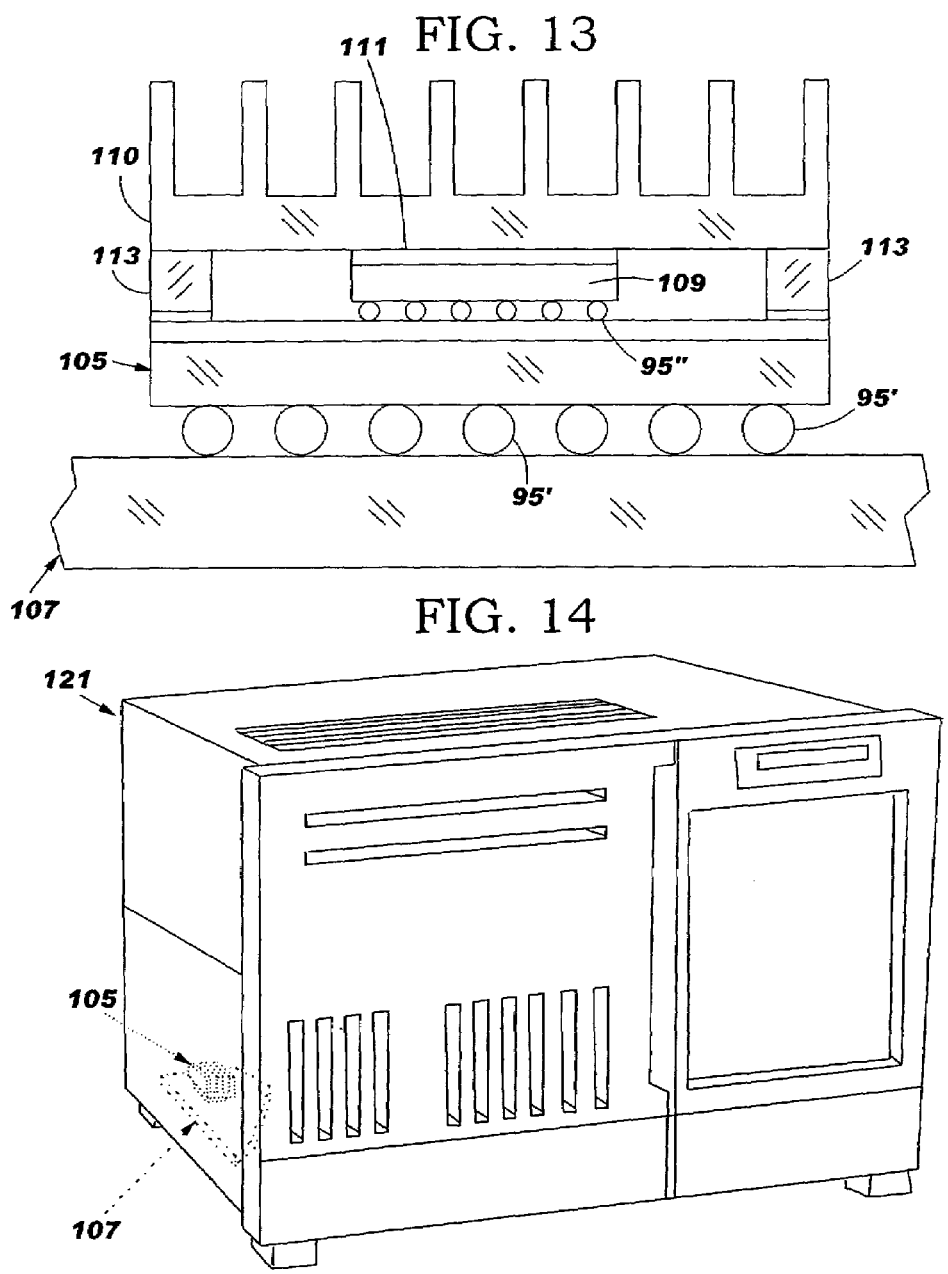

METHOD OF MAKING CIRCUITIZED SUBSTRATE WITH FILLED ISOLATION BORDER

Divisional of prior application No.: 10/882,170, filed Jul. 2, 2004 now U.S. Pat. No. 7,157,647.

TECHNICAL FIELD

This invention relates to circuitized substrates and particularly to those used in multilayered circuit boards, chip carriers, and the like, and to processes for manufacturing same. More particularly, the invention relates to such substrates and resulting assemblies which can be used as part of what are referred to in the art as "information handling systems."

CROSS-REFERENCE TO CO-PENDING APPLICATIONS

In Ser. No. 10/882,170, filed Jul. 2, 2004, and entitled "CIRCUITIZED SUBSTRATE WITH FILLED ISOLATION BORDER, METHOD OF MAKING SAME, ELECTRICAL ASSEMBLY UTILIZING SAME, AND INFORMATION HANDLING SYSTEM UTILIZING SAME", there is defined a circuitized substrate which includes a plurality of contiguous open segments along a side edge portion of the at least one electrically conductive layer thereof, these open segments isolated by a barrier of dielectric material which substantially fills the open segments, e.g., during a lamination process which bonds two dielectric layers of the substrate to the conductive layer. The present application is a divisional application of Ser. No. 10/882,170.

In Ser. No. 10/882,167, filed Jul. 2, 2004, and entitled "CIRCUITIZED SUBSTRATE WITH SPLIT CONDUCTIVE LAYER, METHOD OF MAKING SAME, ELECTRICAL ASSEMBLY UTILIZING SAME, AND INFORMATION HANDLING SYSTEM UTILIZING SAME" (inventors: Lauffer et al), there is defined a circuitized substrate which includes a plurality of contiguous open segments which define facing edge portions within an electrically conductive layer to isolate separate portions of the conductive layer such that the layer can be used for different functions, e.g., as both power and ground elements, within a product (e.g., electrical assembly) which includes the substrate as part thereof. A method of making the substrate, an electrical assembly utilizing the substrate, a multilayered circuitized assembly also utilizing the substrate and an information handling system, e.g., a mainframe computer, are also provided.

BACKGROUND OF THE INVENTION

Electronic structures such as multilayered printed circuit boards (PCBs), laminate chip carriers, and the like permit formation of multiple circuits in a minimum volume or space. These structures typically comprise a stack of layers of signal, ground and/or power planes (lines) separated from each other by a layer of dielectric material. The lines are often in electrical contact with each other by plated holes passing through the dielectric layers. The plated holes are often referred to as "vias" if internally located, "blind vias" if extending a predetermined depth within the board from an external surface, or "plated thru-holes" (PTHs) if extending substantially through the board's full thickness. By the term "thru-hole" as used herein is meant to include all three types of such board openings.

Presently known methods of fabricating PCBs, chip carriers and the like typically comprise fabrication of separate inner-layer circuits (circuitized layers), which are formed by coating a photosensitive layer or film over a copper layer of a copper clad inner-layer base material. The photosensitive coating is imaged, developed and the exposed copper is etched to form conductor lines. After etching, the photosensitive film is stripped from the copper leaving the circuit pattern on the surface of the inner-layer base material. This processing is also referred to as photolithographic processing in the PCB art and further description is not deemed necessary.

Following the formation of individual inner-layer circuits, a multilayer stack is formed by preparing a lay-up of inner-layers, ground planes, power planes, etc., typically separated from each other by a layer of dielectric pre-preg material, the latter typically comprising a layer of glass (typically fiberglass) cloth impregnated with a partially cured material, typically a B-stage epoxy resin. The top and bottom outer layers of the stack usually comprise copper clad, glass-filled, epoxy planar substrates with the copper cladding comprising exterior surfaces of the stack. The stack is laminated to form a monolithic structure using heat and pressure to fully cure the B-stage resin. The stack so formed typically has metal (usually copper) cladding on both of its exterior surfaces. Exterior circuit layers are formed in the copper cladding using procedures similar to the procedures used to form the inner-layer circuits. A photosensitive film is applied to the copper cladding. The coating is exposed to patterned activating radiation and developed. An etchant is then used to remove copper bared by the development of the photosensitive film. Finally, the remaining photosensitive film is removed to provide the exterior circuit layers.

The aforementioned electrically conductive thru-holes (or interconnects) are used to electrically connect individual circuit layers within the structure to each other and to the outer surfaces, and typically pass through all or a portion of the stack. Thru-holes are generally formed prior to the formation of circuits on the exterior surfaces by drilling holes through the stack at appropriate locations. Following several pre-treatment steps, the walls of the holes are catalyzed by contact with a plating catalyst and metallized, typically by contact with an electroless or electrolytic copper plating solution to form conductive pathways between circuit layers. Following formation of the conductive thru-holes, exterior circuits, or outer layers are formed using the procedure described above.

Following substrate construction, chips and/or other electrical components are mounted at appropriate locations on the exterior circuit layers of the multilayered stack, typically using solder mount pads to bond the components to the PCB. The components are often in electrical contact with the circuits within the structure through the conductive thru-holes, as desired. The solder pads are typically formed by coating an organic solder mask coating over the exterior circuit layers. The solder mask may be applied by screen coating a liquid solder mask coating material over the surface of the exterior circuit layers using a screen having openings defining areas where solder mount pads are to be formed. Alternatively, a photoimageable solder mask may be coated onto the board and exposed and developed to yield an array of openings defining the pads. The openings are then coated with solder using processes known to the art such as wave soldering.

Product complexity has increased significantly over the past few years. For example, PCBs for mainframe computers may have as many as 36 layers of circuitry or more, with the complete stack having a thickness of as much as about 0.250 inch (250 mils). These boards are typically designed with three or five mil wide signal lines and twelve mil diameter thru-holes. For increased circuit densification in many of today's electronic products such as PCBs, chip carriers and the like, the industry seeks to reduce signal lines to a width of two mils or less and diameters to two mils or less.

One important requirement of finished PCBs, chip carriers and the like is that the circuitized substrate cannot have exposed external conductors along the sides (edge portions) thereof, as opposed to the upper and/or lower substantially planar surfaces on which various electronic components such as electronic modules, capacitors, resistors, etc. (in the case of a PCB) are mounted. In the case of a chip carrier (which is typically also mounted on a PCB surface), one such surface is usually designed to accommodate a semiconductor chip and the other designed for connectors (e.g., pins, or conductive pads if solder balls are to couple this to an underlying PCB). These surfaces, understandably, include several conductors such as copper mounting pads, exposed signal lines, etc. prior to final assembly. However, the narrower sides (e.g., as thick as 0.250 inch in the above example) are typically not used for having such components electrically coupled thereto. Most importantly, however, such a requirement for no exposed electrical conductors (such as an exposed surface of an internal power or signal plane) is imposed on the industry by Underwriters Laboratory (U.L.) for both safety and functional reasons. These resulting products cannot include exposed conductive portions that might cause an electrical shock to an assembler or other substrate handler, as well as to the final user (e.g., in the case of a computer, the computer assembler and possibly the computer user himself/herself), and/or which might cause malfunction of the substrate due to electrical shorting, e.g., to an adjacent conductor on a connector designed to receive and hold the product (if a PCB) in place or to another, adjacent electronic component (if a chip carrier mounted on a PCB) adjacent such a component or other conductive element).

In U.S. Pat. No. 6,288,906, issued Sep. 11, 2001, there is described a method of making a multi-layer printed circuit board that includes power planes for its outer conductive layers. The outer conductive layers are patterned to accept circuitry, such as integrated circuits and surface mount devices. Mounting pads are provided on the outer conductive layers which include plated-through vias (holes) for electrical interconnection with other conductive layers of the board.

In U.S. Pat. No. 5,912,809, issued Jun. 15, 1999, the electrical potentials and very high frequency (VHF) currents in a circuit board are controlled by patterning the power plane of a multiple layered, capacitive plane printed circuit board in selected geometric patterns. The selected geometric patterns, both simple and complex, control voltages and currents by channeling the capacitance capacity for usage directed to a particular integrated circuit or circuits, isolated to a particular integrated circuit or circuits, or shared between integrated circuits.

In U.S. Pat. No. 5,685,070, issued Nov. 11, 1997, there is described a method of making a printed circuit board or card for direct chip attachment that includes at least one power core, at least one signal plane that is adjacent to the power core, and plated thru-holes for electrical connection is provided. In addition, a layer of dielectric material is adjacent the power core and a circuitized conductive layer is adjacent the dielectric material, followed by a layer of photosensitive dielectric material adjacent the conductive layer. Photodeveloped blind vias for subsequent connection to the power core and drilled blind vias for subsequent connection to the signal plane are provided.

In U.S. Pat. No. 5,418,689, issued May 23, 1995, there is described a method of making a printed circuit board for direct chip attachment that includes at least one power core, at least one signal plane adjacent the power core, and plated thru-holes for electrical connection. In addition, a layer of dielectric material is adjacent the power core and a circuitized conductive layer is adjacent the dielectric material, followed by a layer of photosensitive dielectric material adjacent the conductive layer.

In U.S. Pat. No. 5,384,433, issued Jan. 24, 1995, there is described a method of making a printed circuit board that includes an array of conductive pads including component-mounting holes disposed on first and second surfaces thereon. An array of conductive attachment lands arranged in pairs of first and second attachment lands are disposed on the first and second surfaces. The first and second attachment lands are insulated from one another and separated by a distance selected to allow attachment of standard sized components therebetween on the first and second surfaces of said circuit board. First and second conductive power distribution planes are disposed on the first and second surfaces and are insulated from the conductive pads and the second attachment lands disposed thereon.

Other methods of making circuitized substrates (namely PCBs) are described in the following U.S. Patents:

| | |
|---|---|
| 5,488,540 | Hatta |
| 5,736,796 | Price et al |
| 6,204,453 | Fallon et al |
| 6,418,031 | Archambeault et al |
| 6,557,154 | Harada et al |

As described herein, the present invention represents a significant improvement over known processes, including those described above, used in the production of circuitized substrates such as PCBs. One particularly significant feature of this invention is the provision of a conductive layer such as a power core with a formed edge that is electrically isolated through the use of dielectric material which forms a protective barrier between the substrate's final outer edge portion and the conductive layer's edge.

It is believed that such an invention will represent a significant advancement in the art.

OBJECTS AND SUMMARY OF THE INVENTION

It is a primary object of this invention to enhance the circuitized substrate art.

It is another object of the invention to provide a method of making a circuitized substrate which may be performed using conventional processes known in the art and which is thus relatively easy and inexpensive to implement.

It is another object of this invention to provide various structures which are adaptable for utilizing a substrate so formed by the method taught herein and which thus possess the significant advantages taught herein.

According to one embodiment of the invention, there is provided a circuitized substrate comprising at least one electrically conductive layer of substantially planar configuration and having first and second opposing surfaces, the electrically conductive layer including at least one side edge portion comprised of a plurality of contiguous formed open segments. A first dielectric layer is positioned on the first opposing surface with a portion of the first dielectric layer substantially filling selected ones of the contiguous formed open segments of the side edge portion, and a second dielectric layer is positioned on the second opposing surface, a portion of the second dielectric layer substantially filling the remaining ones of the contiguous formed open segments of the side edge portion, these portions of the first and second dielectric layers providing a substantially solid dielectric covering over the plurality of contiguous formed open segments of the side edge portion.

According to another embodiment of the invention, there is provided a method of making a circuitized substrate, the method comprising providing at least one electrically conductive layer of substantially planar configuration having first and second opposing surfaces, the at least one electrically conductive layer including at least one side edge portion comprised of a plurality of contiguous formed open segments, positioning a first dielectric layer on the first opposing surface, substantially filling selected ones of said contiguous formed open segments of the side edge portion with a portion of the first dielectric layer, positioning a second dielectric layer on the second opposing surface of the electrically conductive layer, substantially filling the remaining ones of the contiguous formed open segments of the side edge portion with a portion of the second dielectric layer, the portions of first and second dielectric layers providing a substantially solid dielectric covering over the plurality of contiguous formed open segments of the side edge portion.

According to yet another embodiment of the invention, there is provided an electrical assembly comprising a circuitized substrate including at least one electrically conductive layer of substantially planar configuration and having first and second opposing surfaces, the electrically conductive layer including at least one side edge portion comprised of a plurality of contiguous formed open segments, a first dielectric layer positioned on the first opposing surface, a portion of the first dielectric layer substantially filling selected ones of the contiguous formed open segments of the side edge portion, and a second dielectric layer positioned on the second opposing surface of the electrically conductive layer, a portion of this second dielectric layer substantially filling the remaining ones of contiguous formed open segments, the portions of first and second dielectric layers providing a substantially solid dielectric covering over the plurality of contiguous formed open segments, and at least one electrical component positioned on and electrically coupled to the circuitized substrate.

According to still another embodiment of the invention, there is provided a multilayered circuitized structure comprising a first circuitized substrate portion including at least one electrically conductive layer of substantially planar configuration and having first and second opposing surfaces, the at least one electrically conductive layer including at least one side edge portion comprised of a plurality of contiguous formed open segments, a first dielectric layer positioned on the first opposing surface of the electrically conductive layer, a portion of this first dielectric layer substantially filling selected ones of the contiguous formed open segments of the side edge portion, and a second dielectric layer positioned on the second opposing surface of the electrically conductive layer, a portion of this second dielectric layer substantially filling the remaining ones of the contiguous formed open segments of the side edge portion, the portions of first and second dielectric layers providing a substantially solid dielectric covering over the plurality of contiguous formed open segments, the circuitized substrate having a first pattern of interconnecting conductive thru-holes therein of a first density. The multilayered structure further includes second and third circuitized substrate portions positioned on opposite sides of the first circuitized substrate portion, each having a second pattern of interconnecting thru-holes therein, this second pattern of interconnecting thru-holes being electrically coupled to the interconnecting conductive thru-holes of the first circuitized substrate portion such that the first circuitized substrate portion provides electrical interconnection between the second and third circuitized substrate portions.

According to another embodiment of the invention, there is provided an information handling system comprising as part thereof a circuitized substrate including at least one electrically conductive layer of substantially planar configuration and having first and second opposing surfaces, the electrically conductive layer including at least one side edge portion comprised of a plurality of contiguous formed open segments, a first dielectric layer positioned on the first opposing surface, a portion of this first dielectric layer substantially filling selected ones of the contiguous formed open segments of the side edge portion, a second dielectric layer positioned on the second opposing surface of the at least one electrically conductive layer, a portion of this second dielectric layer substantially filling the remaining ones of contiguous formed open segments, portions of said first and second dielectric layers providing a substantially solid dielectric covering over the plurality of contiguous formed open segments of the side edge portion, and at least one electrical component positioned on and electrically coupled to said circuitized substrate.

BRIEF DESCRIPTION OF THE DRAWINGS

FIG. 11 is a side-elevational view showing a circuitized substrate interconnecting a pair of opposed electronic components;

FIG. 12 illustrates a plurality of circuitized substrates for being bonded together to form a multilayered circuitized structure in accordance with one embodiment of the invention;

FIG. 13 is a side-elevational view illustrating an electronic assembly which may include circuitized substrates of the type defined herein as part thereof; and FIG. 14 is a perspective view of an information handling system adaptable for utilizing one or more circuitized substrates as taught herein.

BEST MODE FOR CARRYING OUT THE INVENTION

For a better understanding of the present invention, together with other and further objects, advantages and capabilities thereof, reference is made to the following disclosure and appended claims in connection with the above-described drawings.

"Information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as computer servers and mainframes. Such products are well known in the art and are also known to include PCBs and other forms of circuitized substrates as part thereof, some including several such components depending on the operational requirements thereof.

Figure 1:
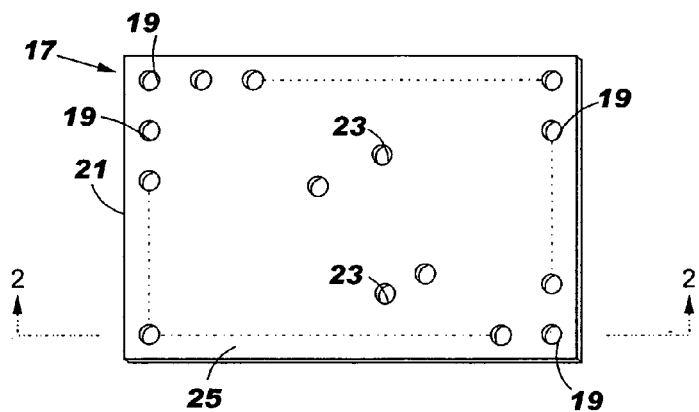
FIGS. 1-10 illustrate the various steps of producing a circuitized substrate in accordance with one embodiment of the invention.

In FIG. 1, there is shown a first step in producing a circuitized substrate according to one embodiment of the invention. In this step, a single sheet 17 of electrically conductive material (preferably copper) of substantially planar and rectangular shape (as shown) is initially provided with a plurality of openings 19 in a substantially linear pattern along at least one side portion 21 of the sheet 17. According to the broad aspects of this invention, it is possible to form a linear array of openings 19 along only one side, but in a preferred embodiment, all four sides of the copper sheet 17 include these openings. Notably, all openings along a single side are not shown in FIG. 1 but it is understood by the dashed lines that these extend from the corners alongside the respective side. In one example, a total of 150 openings 19 may be provided along each side of a copper sheet having dimensions of seventeen inches (width) by seventeen inches (length), thus producing a total of 600 openings 19 within such a singular sheet. In addition, it is possible to also provide clearance openings 23 within the interior portion of the sheet as shown. The purpose of these clearance openings will be understood from the following description. Such clearance openings are not necessary in accordance with the broader aspects of this invention, however.

One ultimate use of sheet 17 is as a power plane within a circuitized substrate formed in accordance with the teachings herein. This is not meant to limit the invention, however, because the sheet as defined herein may also be used as a signal or ground plane, depending on the operational requirements of the final product (circuitized substrate) utilizing same.

Figure 2:
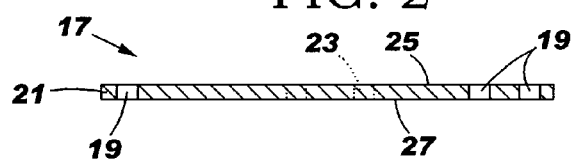

The sheet 17 is shown in FIG. 2 in side view, as taken along the line 2-2 in FIG. 1. With a sheet having the dimensions above, the sheet is preferably of a thickness within the range of from about 0.0005 inch to about 0.004 inch. As stated, the preferred material for sheet 17 is copper, but other conductive metals are possible.

Figure 3:
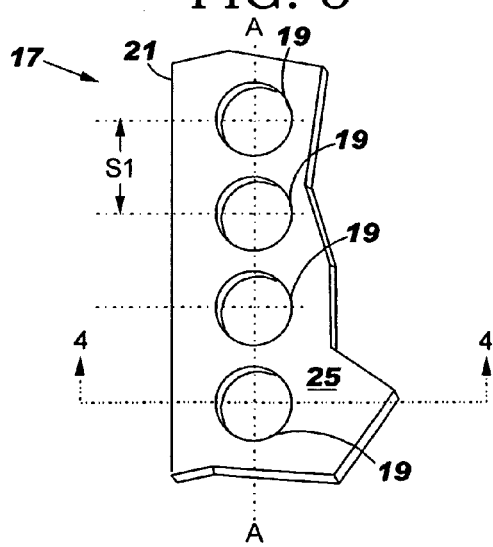

In FIG. 3, there is shown a partial, much enlarged view of sheet 17, showing only the part of one side portion 21. Four openings 19 are illustrated as formed in the described linear pattern along a common axis A-A. It is understood that these openings, each of a diameter of from about 0.040 inch to about 0.200 inch, run along the entire length of side 21, as stated. Preferably, openings of the aforementioned diameter are spaced apart (S1) a distance of from about 0.100 inch to about 0.400 inch. Significantly, it is not essential that the openings be contiguous but instead are preferably spaced as shown, for purposes to be described hereinbelow. The preferred manner for providing openings 19 is to use mechanical drills as is known in the PCB art. If sheet 17 is thin enough, and a properly powered laser can be utilized, it is also within the scope of the invention to provide openings 19 using such a laser. Chemical etching of holes is also possible. This is true for the other openings 23, as well as other openings 19 along the other three sides of sheet 17, if so formed. Sheet 17, being substantially planar, includes first and second opposing, substantially planar surfaces 26 and 27 (FIG. 2).

Figure 4:
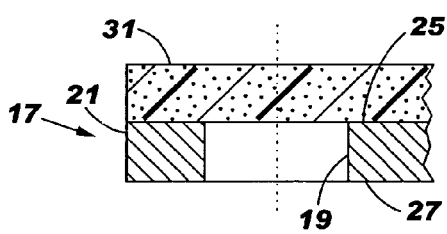
Figure 5:
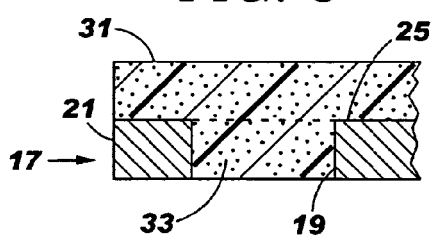

In FIG. 4, a much-enlarged view over FIGS. 1 and 2 (and slightly over FIG. 3), there is shown the positioning of a first dielectric layer 31 atop the sheet 17 to substantially cover each of the openings 19. In FIG. 4, only one opening 19, of a plurality of openings (not shown) is shown for illustration purposes. First dielectric layer 31 is preferably comprised of a fiberglass-reinforced polymer resin of a type known in the art as "FR4" dielectric material. This material includes a polymer resin with the fiberglass serving as reinforcement means. Alternative materials for dielectric layer 31 are possible, examples including other known dielectric materials used in the manufacture of PCBs. One example of such a material is described in pending application Ser. No. 10/812,889, filed Mar. 31, 2004 and entitled, "Dielectric Composition For Forming Dielectric Layer For Use In Circuitized Substrates" (inventors: R. Japp et al). Another material which can be used for layer 37 is a polymer known as Driclad, a dielectric material produced and sold by the assignee of the present invention. Driclad is a registered trademark of Endicott Interconnect Technologies, Inc. FIG. 4, as shown, is taken along the line 4-4 in FIG. 3. The preferred means of positioning layer 31 is to use a lamination process which, as shown in FIG. 5, results in a portion 33 of the layer 31 becoming embedded within (and substantially filling) each of the openings 19. This is a significant aspect of the invention for reasons stated hereinbelow. In one example, utilizing the aforementioned "FR4" material, the layer 31 possessed an initial thickness of about 0.004 inch and, following lamination, a reduced thickness (in FIG. 5) of about 0.0035 inch.

Figure 6:
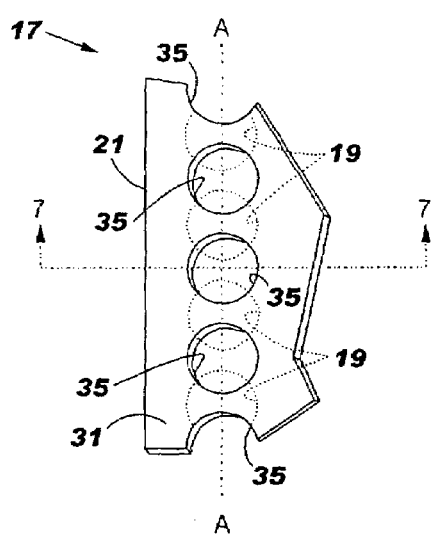

In FIG. 6, sheet 17 with the four initial openings 19 (shown hidden) is shown, the view taken from the top of the structure in FIG. 5, looking down. In FIG. 6, a second plurality of openings 35 are then formed (two being partially shown), preferably of the same diameter as initial openings 19 and spaced a similar distance apart in the "offsetting" orientation relative to earlier provided openings 19 lying underneath. The preferred process for forming openings 35 is the same as that for openings 19. Significantly, this offsetting and spacing orientation results in each opening 35 being substantially centered over the interim strip of underlying copper of sheet 17 between a respective pair of the initially formed openings 19.

Figure 7:
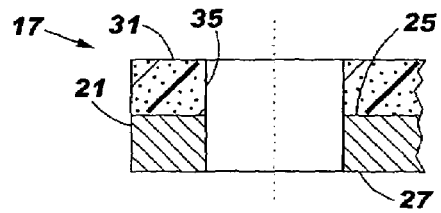

As shown in FIG. 7, taken along the line 7-7 in FIG. 6, each opening 35 extends entirely through the laminated dielectric layer 31 and the underlying copper sheet 17. It is understood that the side portion of sheet 17 has now been "bisected" into two portions, a peripheral portion and an interior portion, as a result of the defined dual drilling operation such that no copper material physically interconnects the outer peripheral portion thereof with the interior portion. As stated, this severing preferably occurs along all four sides of the sheet as shown in FIG. 1, should the openings defined herein be provided along the other remaining sides.

Figure 8:
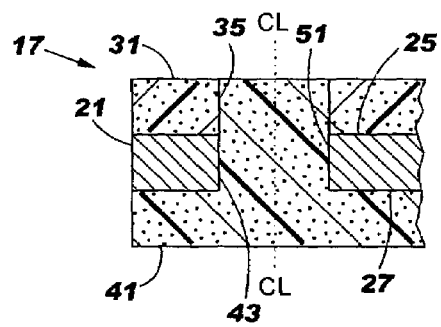

In FIG. 8, a second dielectric layer 41 is then positioned on the second opposing surface 27 of the copper sheet 17 and laminated (preferably using a lamination process similar to that for layer 31) such that a portion 43 of the second dielectric layer 41 will become embedded within and substantially fill each of the second openings 35. As seen in FIG. 8, this portion 43 also extends upwardly within the upper first layer 31 as a result of the lamination process. In one example of the invention, the preferred lamination process for laminating both layers 31 and 41 may be accomplished after the second dielectric layer 41 is positioned, at a temperature within the range of from about 180 to about 250 degrees Celsius (C.), at a pressure of about 100 to about 1200 pounds per square inch (psi), and for a time period of about 30 to about 120 minutes. These parameters are not meant to limit the invention, of course, as other times, temperatures and pressures may be utilized depending on the materials and the various properties thereof (e.g., thickness) chosen.

Figure 10:
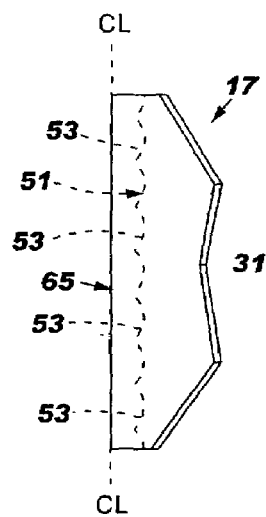
Figure 9:
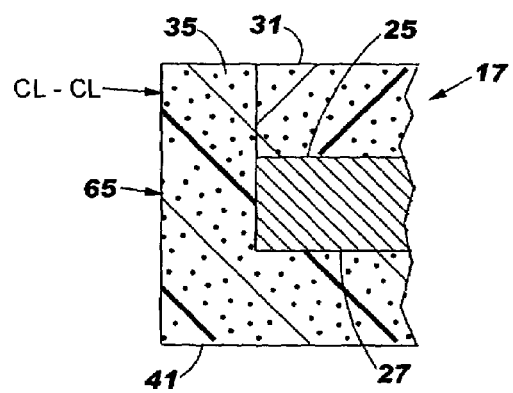

FIGS. 9 and 10 illustrate the resulting substrate when a desired cut is then made along a desired cut line CL-CL (see also FIG. 8) which is preferably substantially along the axis A-A of openings 19 and 35. It is also possible to perform this cut closer to the interior, newly defined exterior surface 51 (FIG. 10) of copper sheet 17. This new exterior surface 51, substantially covered now with a protective layer of dielectric material along the entire external surface of the side portion thereof, may be defined as a plurality of contiguous, formed open segments 53. It is understood these open segments are the partial exterior surfaces of the openings 19 and 35 formed using the process defined above. The resulting structure, as seen in FIG. 9, includes the dielectric materials from the two dielectric layers laminated as defined herein. The side edge portion 51 of the copper sheet 17 is formed as defined herein so as to be as smooth as possible utilizing such a drilling technique. The edge portion 51 shown in FIG. 10 is preferably smoother than that as shown, the drawing being for illustration purposes only. Regardless of smoothness, however, the edge portion 51 is covered by a solid dielectric covering over all of the contiguous open segments of the side edge portion 51 and, following the second lamination step, thus assures a substantially rigid outer planar edge 65 for the structure in FIGS. 9 and 10.

The invention has been defined with respect to providing layers 31 and 41 separately and individually laminating each in a separate lamination step. The invention is not so limited, however, because it is possible, after forming the first pattern of openings 19 in sheet 17 as shown in FIG. 3, to laminate both layers 31 and 41 onto the conductive layer in a single lamination step, using the parameters cited above. Following this single lamination step, it is possible to then form the second pattern of openings 35, these extending through the entire thickness of the laminated 3-layered structure. A second lamination procedure may then be utilized to embed a third dielectric layer (preferably of similar composition as layer 31 and/or layer 41) within the formed openings 35.

In its simplest form, the structure of FIG. 9 may be used as a circuitized substrate in that the conductive layer 17 may be electrically coupled (e.g., using a thru-hole as defined hereinabove) to electronic components such as resistors, capacitors and even larger components such as chip carriers. In a preferred embodiment of the invention, however, the structure of FIG. 9 is preferably provided with a pair of opposing conductive layers 71 and 73 as shown in FIG. 11. Each conductive layer 71 and 73 may be a signal layer (as shown) or, it is also within the scope of the invention for the internal layer 17 to be a signal layer with the outer layers performing another function such as power or ground. The specific orientation of conductive layers is defined by the desired function thereof in the final product and may be in any orientation which satisfies the operational requirements of said product. The embodiment of FIG. 11 is thus meant to be for representative purposes only and is not limitive of the invention. Should layers 71 and 73 be signal layers, each may comprise a plurality of conductive pads, lands, or lines (all being represented by the numeral 75), or combinations thereof. Preferably, these conductive planes 71 and 73 are interconnected using a plurality of conductive thru-holes 81 formed in accordance with known PCB manufacturing techniques. Such thru-holes are preferably of copper and extend through the entire thickness of the FIG. 9 structure to interconnect the opposite layers 71 and 73 as shown. If planes 71 and 73 are signal planes, and plane 17 a power or ground plane, the signal planes preferably will not be electrically connected to plane 17 and hence the reason for the clearance holes 23 described in FIGS. 1 and 2. As stated, it is possible for one or more of the conductive thru-holes 81 to be electrically coupled to plane 17, again depending on the operational requirements for the final circuitized substrate. FIG. 11 thus represents a preferred example of a circuitized substrate which may be produced using the teachings herein.

For a more complex final product, the resulting circuitized substrate may include more than three conductive planes as part thereof. It is possible, using the teachings of the invention, to produce a singular circuitized substrate having a plurality of signal, power and ground planes as part thereof. In such an embodiment, the structure such as formed as shown in FIG. 11 would include additional dielectric layers over the respective conductive planes 71 and/or 73 and additional conductive planes formed thereon, this procedure continuing until the desired number of conductive and dielectric layers are obtained. The embodiment of FIG. 11 is thus representative only and not limitive of the invention.

In the particular embodiment of FIG. 11, the outer conductive pads 75 of the thru-holes 81 may be utilized to interconnect a pair of electronic components 91 and 93 (i.e., utilizing solder balls 95) as shown. In this arrangement, one example of an electronic component 91 may be a chip carrier in which a semiconductor chip is positioned on and electrically coupled to a circuitized substrate and covered, e.g., with a protective covering of "glob top" (a conventional electrically insulative encapsulant material)), such chip carriers produced and sold by the assignee of the present invention. One known such product is referred to as a Hyper-BGA chip carrier, the term Hyper-BGA being a registered trademark of Endicott Interconnect Technologies, Inc. One example of a second electronic component 93 may be a PCB, several types of which are also produced and sold by the assignee of the present invention. In its simplest form, the circuitized substrate in FIG. 11, having but one electrical component positioned thereon, may be defined as an electrical assembly. By way of example, the circuitized substrate in FIG. 11 may itself be a PCB with the component 91 a chip carrier, but not including the underlying substrate 93, this form of electrical assembly also produced and sold by the assignee of this invention. In such an assembly, a lower conductive plane 23 may not be needed with the thru-holes instead being connected to respective internal conductive planes (not shown) in a structure having more conductive internal layers as mentioned above.

In FIG. 12, three circuitized substrates of the type shown in FIG. 11 are shown as being aligned for bonding together to form a multilayered circuitized substrate in accordance with one embodiment of the invention. Each substrate, referred to by the numeral 101 and similar to substrate 17 in FIG. 11, is aligned relative to the other two such that the patterns of thru-holes 81 in all three are aligned. A sheet of known prepreg 103 may be utilized between each pair of substrates 101, and includes a plurality of openings 105 therein so as to enable the land portions 75 of mating thru-holes to become physically engaged to one another. In other words, the process for making the circuitized substrate includes the steps of: providing at least a single electrically conductive sheet of substantially planar configuration having first and second opposing surfaces, said at least a single electrically conductive sheet including at least one side edge portion comprising a plurality of contiguous formed open segments; then providing a first dielectric layer including a first plurality of openings in said first dielectric layer; then positioning said first dielectric layer on said first opposing surface of said at least a single electrically conductive sheet, each of said first plurality of openings being aligned above a respective one of the remaining ones of contiguous formed open segments; then substantially filling selected ones of said contiguous formed open segments of said at least one side edge portion with a portion of said first dielectric layer; then providing a second dielectric layer including a second plurality of openings in said second dielectric layer; then positioning said second dielectric layer on said second opposing surface of said at least a single electrically conductive, each sheet of said second plurality of openings being aligned below a respective one of the remaining ones of contiguous formed open segments; and then substantially filling the remaining ones of said contiguous formed open segments of said at least one side edge portion with a portion of said second dielectric layer, said portions of said first and second dielectric layers providing a substantially solid dielectric covering over said plurality of said contiguous formed open segments of said at least one side edge portion. In another embodiment, it is also possible to utilize conductive paste or the like (not shown) to form this connection between the respective lands. The structure, shown in exploded view in FIG. 12, is now laminated to form a single, compact structure with each of the thru-holes being electrically coupled to form a continuous thru-hole extending through the entire surface of this final structure. It is within the scope of the invention that selected ones of the various thru-holes not extend entirely through the final structure but instead only be coupled to corresponding selected ones of the thru-holes located within the interim circuitized substrate, again depending upon the operational requirements for the finished multilayered structure. The final laminated multilayered circuitized structure may be used as a PCB, chip carrier or other circuitized substrate.

FIG. 13 represents examples of the structures defined hereinabove, the structure referenced by the numeral 105 being a chip carrier while the structure represented by the numeral 107 is a PCB. As stated, both structures are produced and sold by the assignee of the invention. In the embodiment (assembly) of FIG. 13, the chip carrier 105 is mounted on and electrically coupled to PCB 107 using a plurality of solder balls 95', the chip carrier 105 in turn having a semiconductor chip 109 positioned thereon and electrically coupled to the carrier using a second plurality of solder balls 95". The assembly in FIG. 13 may also include a heat sink 110 thermally coupled to chip 109 using a conductive paste 111 and positioned on the upper surface of carrier 105 by appropriate standoffs 113, as is known in the art.

In FIG. 14, there is shown an information handling system 121 which is preferably a personal computer, a mainframe computer or a computer server. Other types of information handling systems known in the art of this type may also utilize the teachings of this invention. The circuitized substrate or substrates as formed in accordance with the teachings herein may be utilized in the system 121 as a PCB 107 (shown hidden) and/or a chip carrier 105 (also shown hidden). The circuitized substrates may be utilized as a motherboard in system 121 or as one or more individual PCBs typically utilized in such systems. The remaining elements of information handling systems of these types are known in the art and further description is not believed necessary.

Thus there has been shown and described a circuitized substrate which utilizes at least one conductive plane therein formed in a new and unique manner so as to assure the side edge portion(s) of the substrate are protected by a barrier (covering) of dielectric material so as to prevent inadvertent electrical shock or grounding or arcing to other conductive structures such as may be utilized in a system 121 including the invention. The various structures which may utilize one or more circuitized substrates taught herein thus also inherit the several advantageous features of this structure. The circuitized substrate as defined may be produced using known PCB manufacturing processes and thus at relatively low cost, thus presenting the possibility of lower costs for the assemblies utilizing these substrates.

While there have been shown and described what are at present the preferred embodiments of the invention, it will be obvious to those skilled in the art that various changes and modifications may be made therein without departing from the scope of the invention as defined by the appended claims.

What is claimed is:

1. A method of making a circuitized substrate, said method comprising:

providing a single electrically conductive sheet of substantially planar configuration having first and second opposing surfaces, said single electrically conductive sheet including at least one side edge portion comprising a first plurality of openings;

positioning a first dielectric layer on said first opposing surface of said single electrically conductive sheet;

substantially filling selected ones of said first plurality of openings of said one side edge portion with a portion of said first dielectric layer;

forming a second plurality of openings in said first dielectric layer;

positioning a second dielectric layer on said second opposing surface of said single electrically conductive sheet; and substantially filling the remaining ones of said second plurality of openings of said one side edge portion with a portion of said second dielectric layer, said portions of said first and second dielectric layers providing a substantially solid dielectric covering over a plurality of the contiguous formed open segments of said at least one side edge portion.

2. The method of claim 1 wherein said plurality of contiguous formed open segments are provided using a drilling operation.

3. The method of claim 2 wherein said drilling operation is accomplished using mechanical drills.

4. The method of claim 2 wherein said drilling operation is accomplished using a laser.

5. The method of claim 1 wherein said positioning said first dielectric layer on said first opposing surface of said single electrically conductive sheet and said substantially filling said selected ones of said first plurality of openings of said one side edge portion with a portion of said first dielectric layer are accomplished utilizing a lamination process.

6. The method of claim 1 wherein said positioning said second dielectric layer on said second opposing surface of said single electrically conductive sheet and said substantially filling said remaining ones of said second plurality of openings of said one side edge portion with a portion of said second dielectric layer are accomplished utilizing a lamination process.

* * * * *